(12) United States Patent
Hoeppel

(10) Patent No.: US 9,263,655 B2
(45) Date of Patent: Feb. 16, 2016

(54) OPTOELECTRONIC COMPONENT AND METHOD FOR THE PRODUCTION THEREOF

(75) Inventor: Lutz Hoeppel, Alteglofsheim (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 506 days.

(21) Appl. No.: 13/807,578

(22) PCT Filed: May 25, 2011

(86) PCT No.: PCT/EP2011/058579
§ 371 (c)(1),
(2), (4) Date: Mar. 11, 2013

(87) PCT Pub. No.: WO2012/000725
PCT Pub. Date: Jan. 5, 2012

(65) Prior Publication Data
US 2013/0187192 A1    Jul. 25, 2013

(30) Foreign Application Priority Data
Jun. 28, 2010   (DE) .......................... 10 2010 025 320

(51) Int. Cl.
| H01L 33/00 | (2010.01) |
| --- | --- |
| H01L 33/62 | (2010.01) |
| H01L 31/02 | (2006.01) |
| H01L 31/0236 | (2006.01) |
| H01L 33/38 | (2010.01) |
| H01L 27/144 | (2006.01) |
| H01L 31/18 | (2006.01) |
| H01L 33/02 | (2010.01) |
| H01L 33/44 | (2010.01) |

(52) U.S. Cl.
CPC .............. *H01L 33/62* (2013.01); *H01L 27/144* (2013.01); *H01L 31/02005* (2013.01); *H01L 31/0236* (2013.01); *H01L 31/18* (2013.01); *H01L 33/025* (2013.01); *H01L 33/382* (2013.01); *H01L 33/0079* (2013.01); *H01L 33/44* (2013.01); *H01L 2924/0002* (2013.01); *Y02E 10/50* (2013.01)

(58) Field of Classification Search
CPC ............................. H01L 27/382; H01L 33/64
USPC .................................................... 257/98–100
See application file for complete search history.

(56) References Cited

U.S. PATENT DOCUMENTS

| 6,800,551 | B2 | 10/2004 | Nagahara et al. |
| 7,696,522 | B2 | 4/2010 | Ono et al. |
| 2003/0230754 | A1 | 12/2003 | Steigerwald et al. |

(Continued)

FOREIGN PATENT DOCUMENTS

| CN | 1768434 A | 5/2006 |
| DE | 103 25 951 A1 | 12/2003 |

(Continued)

*Primary Examiner* — Samuel Gebremariam
(74) *Attorney, Agent, or Firm* — Slater & Matsil, L.L.P.

(57) ABSTRACT

An optoelectronic component has a semiconductor chip and a carrier, which is bonded to the semiconductor chip by means of a bonding layer of a metal or a metal alloy. The semiconductor chip includes electrical connection regions facing the carrier and the carrier includes electrical back contacts on its back remote from the semiconductor chip. The back contacts are connected electrically conductively to the first electrical or second connection region respectively, in each case by at least one via extending through the carrier. The first and/or second electrical back contact is connected to the first or second electrical connection region respectively by at least one further via extending through the carrier.

19 Claims, 12 Drawing Sheets

(56) References Cited

U.S. PATENT DOCUMENTS

| | | |
|---|---|---|
| 2004/0188696 A1 | 9/2004 | Hsing Chen et al. |
| 2005/0274970 A1* | 12/2005 | Ludowise .................. 257/99 |
| 2006/0278885 A1 | 12/2006 | Tain et al. |
| 2010/0171135 A1 | 7/2010 | Engl et al. |
| 2011/0241031 A1 | 10/2011 | von Malm et al. |
| 2012/0086026 A1 | 4/2012 | Engl et al. |
| 2012/0322186 A1 | 12/2012 | Rode et al. |

FOREIGN PATENT DOCUMENTS

| | | |
|---|---|---|
| DE | 10 2007 022 947 A1 | 10/2008 |
| DE | 10 2008 011 848 A1 | 9/2009 |
| DE | 10 2008 062 933 A1 | 7/2010 |
| JP | 8227894 A | 9/1996 |
| JP | 2003167345 A | 6/2003 |
| JP | 2005322722 A | 11/2005 |
| JP | 2006086191 A | 3/2006 |
| JP | 2006521699 A | 9/2006 |
| JP | 200970869 A | 4/2009 |
| TW | 200403869 A | 3/2004 |
| TW | 201004000 A | 1/2010 |
| WO | WO 2007/121735 A2 | 11/2007 |
| WO | 2009064330 A2 | 5/2009 |
| WO | WO 2009/155897 A1 | 12/2009 |

* cited by examiner

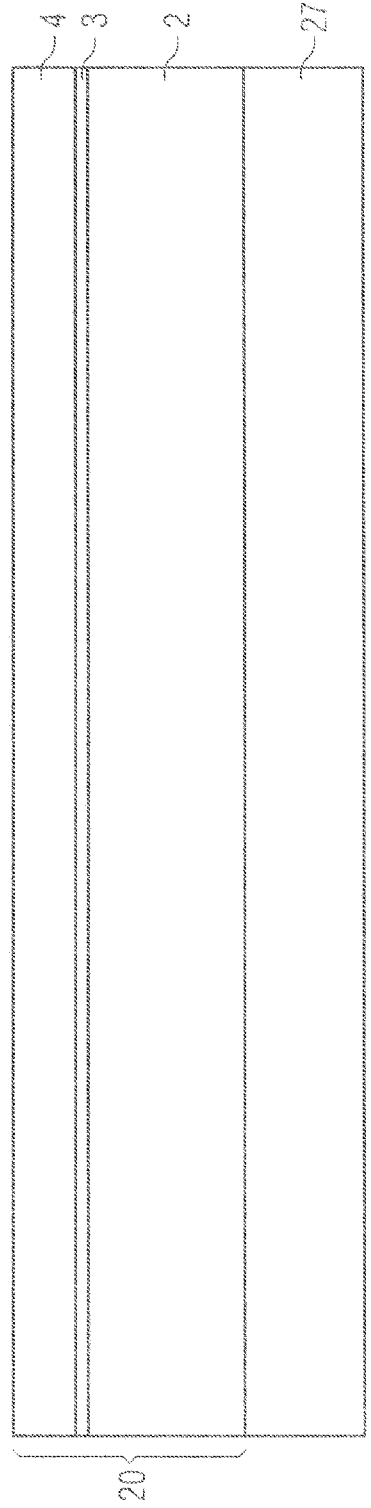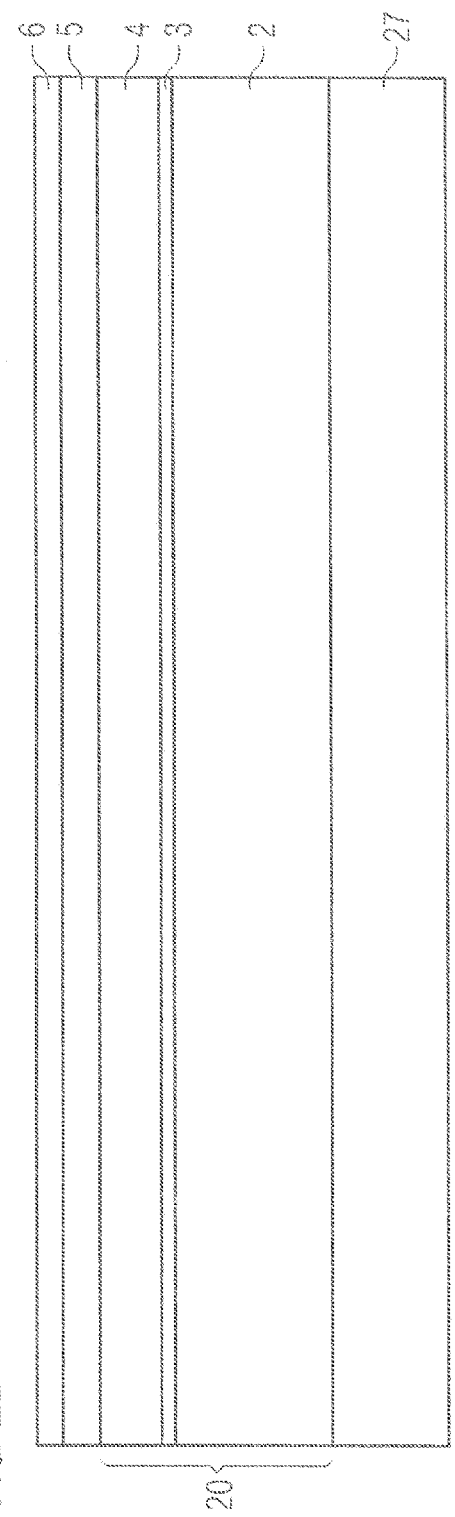

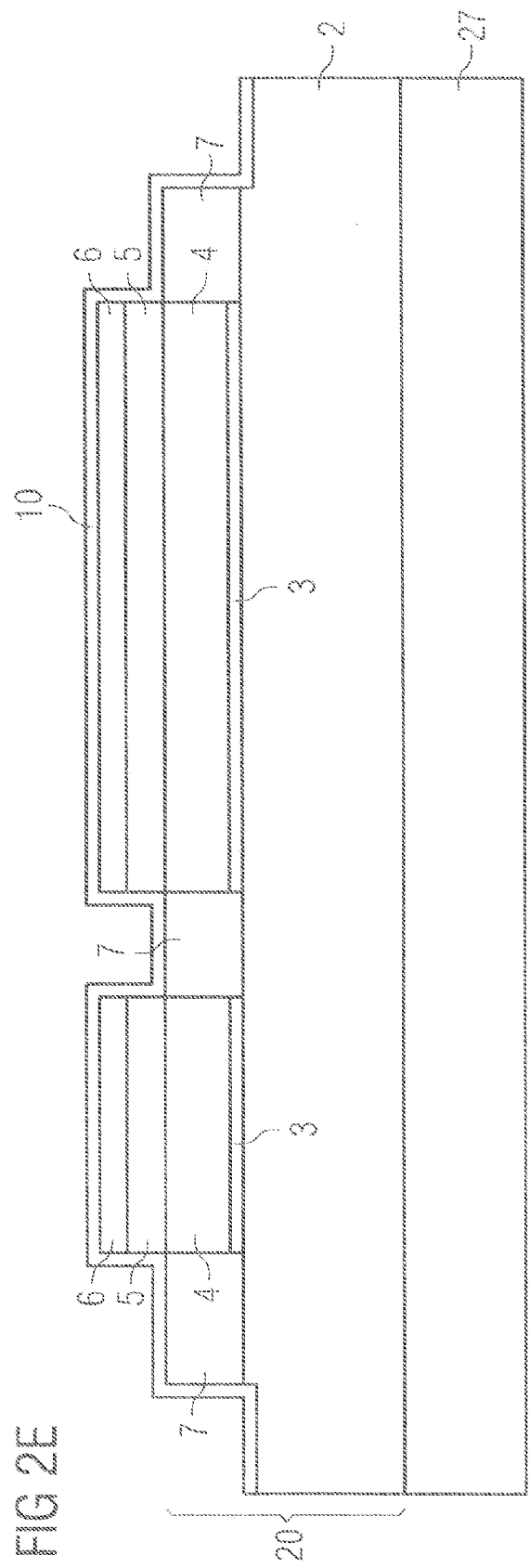

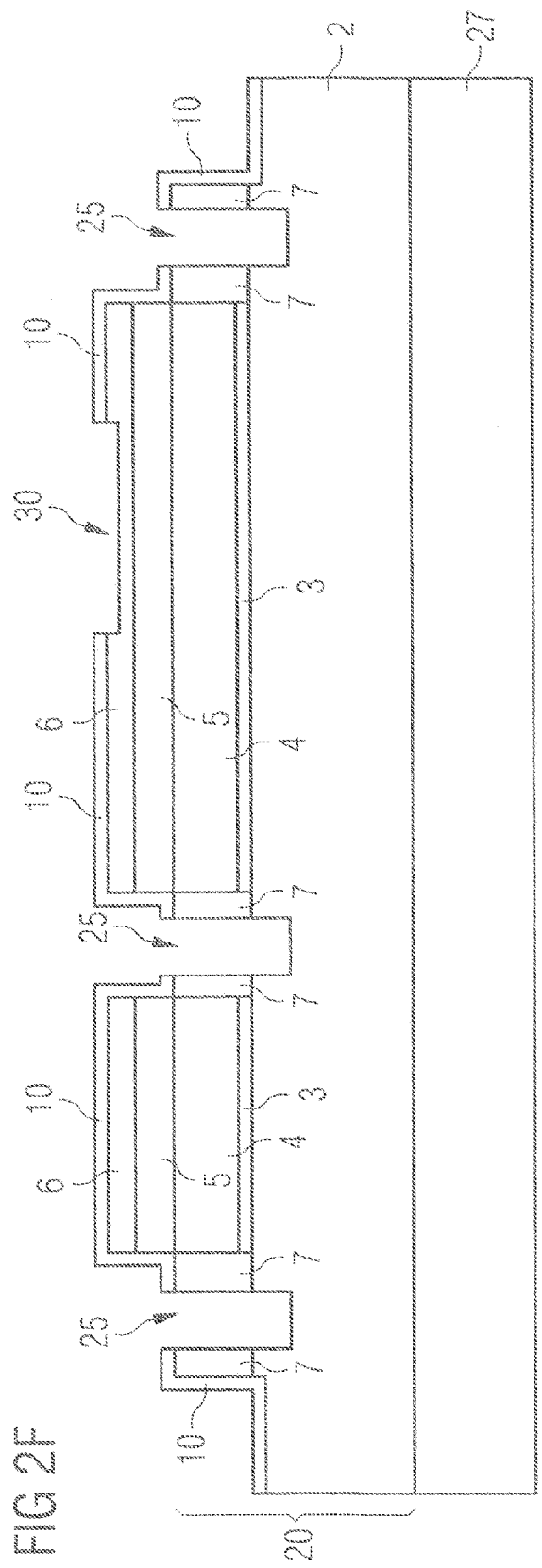

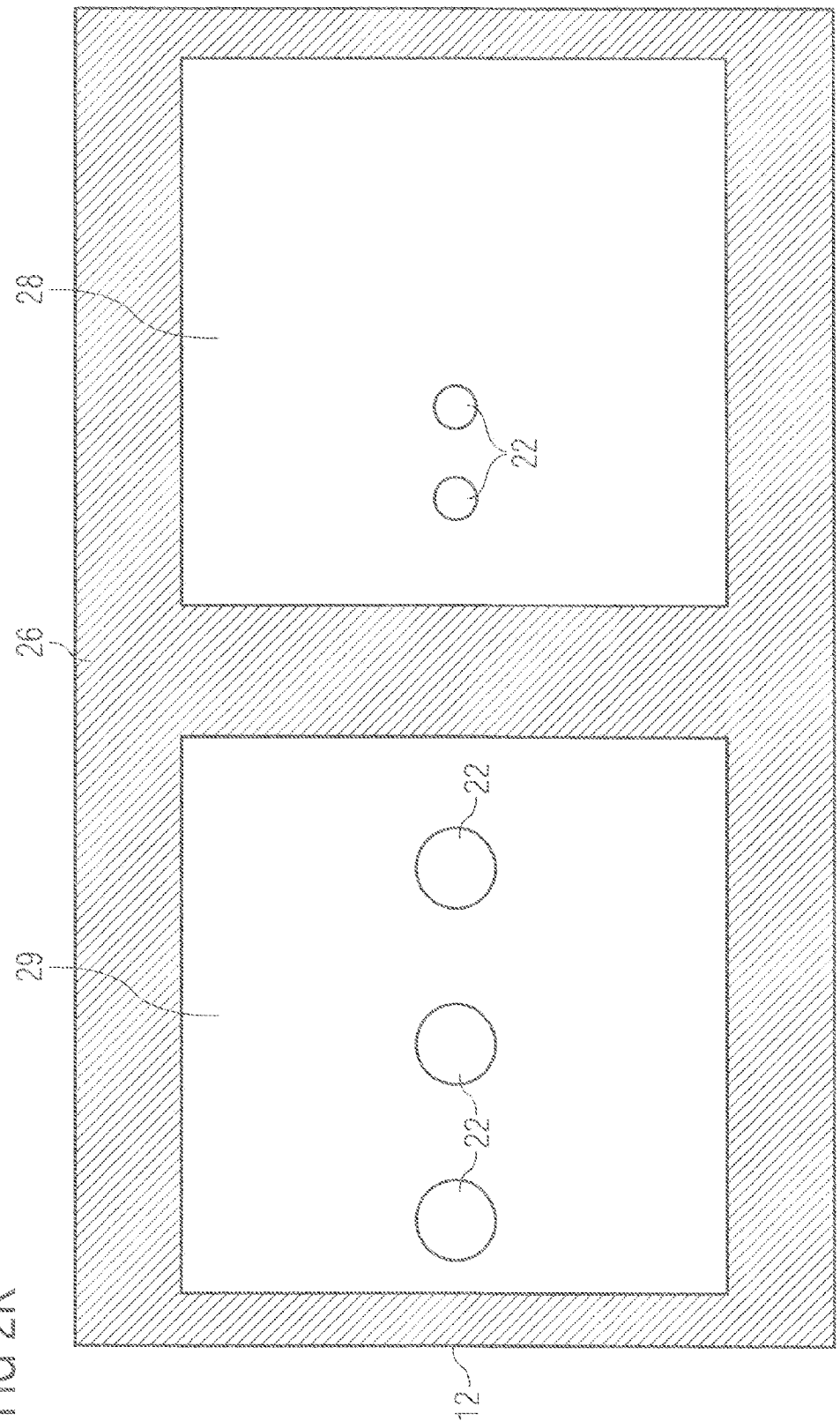

OPTOELECTRONIC COMPONENT AND METHOD FOR THE PRODUCTION THEREOF

This patent application is a national phase filing under section 371 of PCT/EP2011/058579, filed May 25, 2011, which claims the priority of German patent application 10 2010 025 320.0, filed Jun. 28, 2010, each of which is incorporated herein by reference in its entirety.

TECHNICAL FIELD

The application relates to an optoelectronic component, which comprises a semiconductor body and a carrier substrate bonded to the semiconductor body by means of a bonding layer.

SUMMARY OF THE INVENTION

In one aspect, the invention provides an improved optoelectronic component which is surface-mountable and is distinguished by good current carrying capacity. Furthermore, an advantageous method for producing such an optoelectronic component is provided.

According to one embodiment the optoelectronic component comprises a semiconductor chip, which comprises a semiconductor layer sequence with an active layer. The active layer is preferably a layer suitable for emitting radiation. Alternatively, however, the active layer may also be a radiation-detecting layer.

The optoelectronic component is preferably an LED or a radiation detector.

Furthermore, the optoelectronic component comprises a carrier, which is bonded to the semiconductor chip by means of a bonding layer. The carrier may in particular be formed of a semiconductor material such as for example silicon. Preferably, the semiconductor material of the carrier is undoped. The bonding layer preferably comprises a metal or a metal alloy.

Furthermore, the semiconductor chip comprises a first electrical connection region and a second electrical connection region, the first electrical connection region and the second electrical connection region facing the carrier. In particular, the first electrical connection region may form the p-contact of the semiconductor chip and the second electrical connection region the n-contact of the semiconductor chip.

The first electrical connection region and the second electrical connection region are preferably separated from one another by a recess in the semiconductor chip. The recess may in this case be filled with an electrically insulating material, in particular a polymer.

The first and second electrical connection regions of the semiconductor chip may in particular be formed by a contact metallisation layer sequence, for example Ti/Pt/Au, facing the carrier. The first electrical connection region and the second electrical connection region are preferably arranged in one plane and advantageously each adjoin mutually insulated sub-regions of the bonding layer.

According to one embodiment, the carrier comprises a first electrical back contact and a second electrical back contact on a back remote from the semiconductor chip. The electrical back contacts of the carrier are intended in particular for surface mounting of the optoelectronic component, i.e., the optoelectronic component may be electrically connected to the carrier back contacts without using wire leads, for example to the conductor tracks of a printed circuit board by means of soldered joints.

The first electrical back contact is connected electrically conductively to the first electrical connection region by at least one via extending through the carrier. Furthermore, the second electrical back contact is connected electrically conductively to the second electrical connection region by at least one via extending through the carrier. Thus, the vias through the carrier connect the carrier back contacts to the first electrical connection region and the second electrical connection region of the semiconductor chip in an electrically conductive manner.

The first and/or second electrical back contact is connected to the first or second electrical connection region respectively by at least one further via extending through the carrier. Thus, at least one of the electrical back contacts is connected to the associated electrical connection region of the semiconductor chip by at least two or more vias extending through the carrier. Preferably, both the first and second electrical back contacts are connected to the first and second electrical connection regions respectively, in each case by at least two vias extending through the carrier.

By increasing the number of vias connecting the first or second electrical back contacts to the associated electrical connection region of the semiconductor chip, the current carrying capacity of the optoelectronic component is advantageously increased, since the current flow between the respective back contact of the carrier and the associated electrical connection region of the semiconductor chip is distributed over the multiple vias.

In a further advantageous configuration, at least one of the vias has a width of at least 30 µm. The width of the via is here understood to mean the dimension of the via in the direction extending parallel to the main plane of the carrier. The vias may for example be cylindrical, such that their width is equal to the diameter of their circular cross-sectional area.

The current carrying capacity of the optoelectronic component may be further improved by a comparatively large via width. Preferably all the vias in the carrier have a width of at least 30 µm.

In one particularly preferred configuration, at least one of the vias has a width of at least 60 µm. It is in particular also possible for all the vias in the carrier to have a width of at least 60 µm. In this way, a particularly good current carrying capacity is achieved for the optoelectronic component. On the other hand, however, the vias should as far as possible be no wider than 100 µm, to avoid mechanical instability of the carrier.

The multiple vias extending through the carrier do not necessarily have to have the same width. Rather, it may be advantageous for a via arranged on a side facing the semiconductor chip in the vicinity of a recess in the bonding layer, for example a cavity or an insulating layer, to have a smaller width than the other vias. Such an interruption in the bonding layer between the carrier and the semiconductor chip produced by an insulating layer or a cavity may be provided in particular to insulate the first electrical connection region of the semiconductor chip and the second electrical connection region of the semiconductor chip from one another. Such an interruption in the bonding layer could lead to mechanical instability of the bond between the carrier and the semiconductor chip, if the carrier were also to comprise an interruption produced by a particularly wide via in the vicinity of this point. For this reason, it is advantageous for a via arranged in the vicinity of such an interruption in the bonding layer to have a smaller width than the other vias.

In a further advantageous configuration, the semiconductor layer sequence comprises an n-doped semiconductor region and a p-doped semiconductor region, the p-doped semiconductor region facing the carrier. The semiconductor chip comprises a first electrical connection layer, which connects the first electrical connection region to the p-doped semiconductor region. Furthermore, the semiconductor chip comprises a second electrical connection layer, which connects the second electrical connection region to the n-doped semiconductor region.

A sub-region of the second electrical connection layer preferably extends through at least one hole, which passes through the p-doped semiconductor region and the active layer, into the n-doped semiconductor region. In the region of the hole, the second electrical connection layer is advantageously insulated from the p-doped semiconductor region and the active layer. Because the second electrical connection layer is guided through a hole in the p-doped semiconductor region and the active layer into the n-doped semiconductor region, instead of for example guiding them over previously insulated side faces of the semiconductor chip to the n-doped semiconductor region, the current carrying capacity and reliability of the optoelectronic component are improved.

Insulation of the second electrical connection layer from the p-doped semiconductor region and the active layer in the region of the hole may be achieved for example by an electrically insulating layer, in particular an $SiO_2$ layer. In one advantageous configuration, the p-doped semiconductor region and the active layer are passivated in the vicinity of the hole by bombardment with argon ions. This advantageously reduces production complexity.

In a particularly preferred configuration, the second electrical connection layer comprises a plurality of sub-regions extending through a plurality of holes, which pass through the p-doped semiconductor region and the active layer, into the n-doped semiconductor region. Because the second electrical connection layer extends through a plurality of holes into the n-doped semiconductor region, the current carrying capacity of the optoelectronic component is further improved.

In a further advantageous configuration of the optoelectronic component, the bonding layer between the carrier and the semiconductor chip comprises at least two sub-regions insulated electrically from one another, which are separated from one another by an electrically insulating material. The first sub-region of the bonding layer is bonded in particular with the first electrical connection region of the semiconductor chip and by way of the at least one via to the first back contact of the carrier. Accordingly, the second sub-region of the bonding layer is connected electrically conductively to the second electrical connection region of the semiconductor chip and by way of at least one via to the second back contact of the carrier. The electrically insulating material which insulates the first and second sub-regions of the bonding layer electrically from one another is preferably a polymer. The polymer may in particular be a polyimide. Alternatively it is also feasible for the first and second sub-regions of the bonding layer to be separated from one another by a cavity, the electrically insulating material in this case being air.

In a further advantageous configuration, the vias are of the same metal or the same metal alloy as the bonding layer. In particular, in the method of producing the optoelectronic component described in greater detail below, the vias are formed in the same method step as the bonding layer, so advantageously reducing production complexity.

In a particularly advantageous configuration, the first electrical back contact and the second electrical back contact are made from the same metal or the same metal alloy as the vias. It is also possible, in particular, to form the back contacts in the same method step as the vias and the bonding layer. Advantageously, the bonding layer, the vias and the electrical back contacts are thus in each case formed of the same metal or the same metal alloy.

The metal or metal alloy is preferably Cu, Au, or BiAg. These materials are distinguished by good electrical conductivity and are thus advantageous for achieving good current carrying capacity of the optoelectronic component.

The metal or the metal alloy of which the bonding layer and preferably also the vias and/or the back contacts are formed is preferably free of shrinkage holes. The reliability and the current carrying capacity of the optoelectronic component is advantageously increased by a bonding layer free of shrinkage holes. The production method described below for the optoelectronic component makes it possible to produce the bonding layer and the vias and/or the back contacts without shrinkage holes.

In one configuration of the method of producing an optoelectronic component, the carrier, which comprises a plurality of openings to form the vias, and the semiconductor chip, which comprises the first electrical connection region and the second electrical connection region, are provided.

The first electrical connection region and the second electrical connection region are separated from one another by a recess in the semiconductor chip.

The recess between the first electrical connection region and the second electrical connection region is filled with an electrically insulating material in such a way that the electrically insulating material projects over a sub-region of the connection regions. Then the carrier is placed onto the semiconductor chip, the electrically insulating material which projects over the connection regions functioning as a spacer layer, such that a space arises between the semiconductor chip and the carrier. The spacer layer may for example be of annular configuration.

In a further method step, a liquid metal or a liquid metal alloy is introduced through the openings in the carrier into the space, the metal or the metal alloy forming the bonding layer and the vias after solidification.

The method on the one hand has the advantage that the bonding layer and the vias are formed in a single method step. It has moreover proven advantageous that in this method of producing the bonding layer and the vias, in contrast to a conventional soldering method, a bonding layer is formed which is free of shrinkage holes. This increases the current carrying capacity and the long-term stability of the optoelectronic component.

In an advantageous variant of the method, the back contacts are also formed during formation of the bonding layer and the vias, wherein prior to introduction of the liquid metal or the liquid metal alloy into the openings in the carrier, a patterned layer is applied to the back of the carrier, which layer serves as a mask to form the first and second back contacts. The patterned layer prevents the liquid metal or the liquid metal alloy from covering the entire back of the carrier once the space and the openings for the vias have been filled. Instead, only the regions of the carrier not covered by the patterned layer are covered by the liquid metal or the liquid metal alloy, so forming the first and second back contacts. In this variant of the method, the bonding layer, the vias and the back contacts are thus produced in a single method step.

In one advantageous configuration, the electrically insulating material which functions as a spacer between the semiconductor chip and the carrier is a polymer. In particular, the electrically insulating material is a polyimide.

BRIEF DESCRIPTION OF THE DRAWINGS

The invention is explained in greater detail below with reference to exemplary embodiments in conjunction with FIGS. 1 and 2, in which:

FIGS. 2A to 2M are schematic representations of the intermediate steps of an exemplary embodiment of the method for producing the optoelectronic component.

In the figures identical or equivalently acting components are in each case denoted with the same reference numerals. The components illustrated and the size ratios of the components to one another should not be regarded as to scale.

DETAILED DESCRIPTION OF ILLUSTRATIVE EMBODIMENTS

Figure 1:
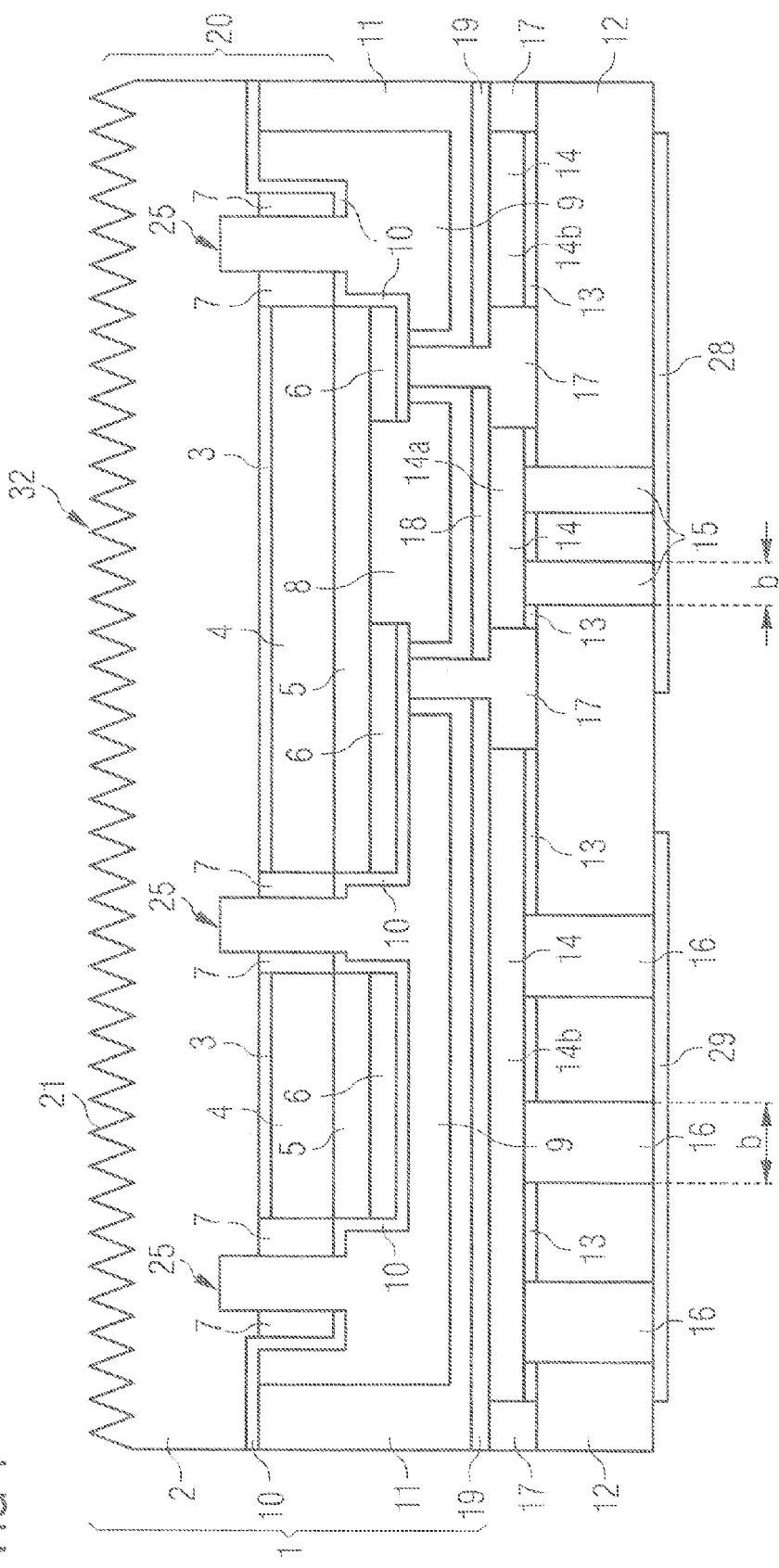
FIG. 1 is a schematic representation of a cross section through an optoelectronic component according to a first exemplary embodiment of the invention.

The optoelectronic component illustrated in schematic cross-section in FIG. 1 includes a semiconductor chip 1, which comprises a semiconductor layer sequence 20. The semiconductor layer sequence 20 may for example include an n-doped semiconductor region 2 and a p-doped semiconductor region 4, an active layer 3 being arranged between the n-doped semiconductor region 2 and the p-doped semiconductor region 4.

The active layer 3 of the optoelectronic component may in particular be an active layer 3 suitable for emitting radiation. In this case the optoelectronic component is a luminescent diode, in particular an LED. Alternatively, it would also be feasible for the active layer 3 to be a radiation-detecting layer, the optoelectronic component in this case being a detector component. The active layer may for example take the form of a pn-junction, of a double heterostructure, of a single quantum well structure or of a multiple quantum well structure. The term "quantum well structure" here includes any structure in which charge carriers undergo quantisation of their energy states by confinement. In particular, the term quantum well structure does not provide any indication of the dimensionality of the quantisation. It thus encompasses inter alia quantum wells, quantum wires and quantum dots and any combination of these structures.

The semiconductor layer sequence 20 of the semiconductor chip 1 is preferably based on a III-V compound semiconductor material, in particular on an arsenide, nitride- or phosphide compound semiconductor material. For example the semiconductor layer sequence 20 may contain $In_xAl_yGa_{1-x-y}N$, $In_xAl_yGa_{1-x-y}P$ or $In_xAl_yGa_{1-x-y}As$, in each case with $0 \leq x \leq 1$, $0 \leq y \leq 1$ and $x+y \leq 1$. In this case, the III-V compound semiconductor material does not absolutely have to comprise a mathematically exact composition according to one of the above formulae. Instead, it may comprise one or more dopants and additional constituents which do not substantially modify the physical characteristics of the material. For simplicity's sake, however, the above formulae include only the fundamental constituents of the crystal lattice, even if these may in part be replaced by small quantities of further substances.

The semiconductor chip 1 is bonded to a carrier 12 by means of a bonding layer 14 of a metal or a metal alloy. The carrier 12 may in particular comprise a semiconductor material, preferably an undoped semiconductor material. The semiconductor material of the carrier 12 is preferably silicon. The side of the carrier facing the bonding layer 14 may be provided with a wetting layer 13.

The semiconductor chip 1 comprises a first electrical connection region 18 and a second electrical connection region 19. The electrical connection regions 18, 19 are preferably formed by contact metallizations, which may for example comprise a Ti/Pt/Au layer sequence. Both the first electrical connection region 18 and the second electrical connection region 19 of the semiconductor chip face the carrier 12.

The carrier 12 comprises a first electrical back contact 28 and a second electrical back contact 29 on its back remote from the semiconductor chip 1. The two electrical back contacts 28, 29 on the back of the carrier 12 are intended in particular for surface mounting of the optoelectronic component. In particular, the optoelectronic component may be connected at the back contacts 28, 29 to the conductor tracks of a printed circuit board for example by means of a soldered joint. The optoelectronic component is thus a surface-mountable optoelectronic component and in particular does not comprise any wire leads.

The first electrical back contact 28 and the second electrical back contact 29 are connected in each case to the first electrical connection region 18 and the second electrical connection region 19 respectively by means of at least one via 15, 16 and by way of the bonding layer 14. In the exemplary embodiment illustrated, two vias 15 are advantageously formed in the carrier 12 to connect the first back contact 28 to the first electrical connection region 18. Three vias 16 are advantageously formed in the carrier 12 to connect the second electrical back contact 29 to the first electrical connection region 19. Because the back contacts 28, 29 are each connected to the electrical connection regions 18, 19 of the semiconductor chip 1 by means of multiple vias 15, 16, the current carrying capacity of the optoelectronic component is advantageously increased.

The vias 15, 16 advantageously have a width b of at least 30 μm, particularly preferably of at least 60 μm. For example, the vias 15, 16 may be cylindrical, with a diameter of at least 30 μm or preferably at least 60 μm. However, other cross-sectional areas are also feasible for the vias 15, 16, for example the vias 15, 16 may exhibit rectangular, in particular square, cross-sectional areas. The current carrying capacity of the optoelectronic component is further improved by a comparatively large via width.

In the exemplary embodiment illustrated, the vias 15, 16 do not all have the same width. In particular, the vias 15 have a smaller width than the vias 16. For example, the width of the vias 15 may amount to 30 μm or more, and the width of the vias 16 may amount to 60 μm or more. The vias 15 have a smaller width, since they are arranged in the vicinity of regions of the bonding layer 14 at which the bonding layer 14 is interrupted by an electrically insulating material 17, in particular a polymer. The insulating material 17, which may in particular be polyimide, serves to subdivide the bonding layer 14 into a first sub-region 14a, which is connected electrically conductively to the first electrical connection region 18 and by way of the vias 15 to the first back contact 28, and a second sub-region 14b, which is connected electrically conductively to the second electrical connection region 19 and by way of the vias 16 to the second back contact 29. The bonding layer 14 is preferably also interrupted by the insulating material 17 at the sides of the semiconductor chip 1. This advantageously prevents the metal or the metal alloy of the bonding layer 14 from reaching the side walls of the carrier 12 on bonding of the carrier 12 to the semiconductor chip 1 and there possibly joining up with the material of the back contacts 28, 29. This might otherwise possibly result in a short circuit.

The interruptions to the bonding layer 14 by the electrically insulating regions 17 could lead to mechanical instability, if the carrier 12 were also interrupted comparatively significantly in the vicinity of these interruptions. For this reason, the vias 15 arranged in the vicinity of the interruptions in the bonding layer caused by the electrically insulating material 17 are smaller in width than the vias 16.

The electrically insulating material 17 which subdivides the bonding layer 14 into electrically mutually insulated sub-regions 14a, 14b does not necessarily have to be a polymer, such as for example polyimide. It is alternatively also feasible for the interruption to be achieved by cavities, such that the electrically insulating material 17 is air.

The bonding layer 14, which bonds the semiconductor chip 1 and the carrier 12 together, is made from a metal or a metal alloy. The metal or the metal alloy may in particular be Cu, Au, AuSn or BiAg. The vias 15, 16 are preferably made of the same material as the bonding layer 14. It is in particular possible to produce the vias 15, 16 in the same method step as the bonding layer 14. Particularly advantageously, the back contacts 28, 29 are also made of the same material as the vias 15, 16 and/or the bonding layer 14. It is in particular also possible to produce the back contacts 28, 29 in the same method step as the bonding layer 14 and the vias 15, 16.

To achieve a high current carrying capacity and good long-term stability of the optoelectronic component, the metal or the metal alloy from which the bonding layer 14, the vias 15, 16 and preferably also the back contacts 28, 29 are formed is free of shrinkage holes.

In the semiconductor chip 1, the first electrical connection region 18 is connected electrically conductively to the p-doped semiconductor region 4 by means of a first electrical connection layer 8. The second electrical connection region 19 is connected electrically conductively to the n-doped semiconductor region 2 by means of a second electrical connection layer 9. The semiconductor chip 1 includes an electrically insulating layer 10, for example an $SiO_2$ layer, which insulates from one another regions of the semiconductor chip 1 connected to the first electrical connection region 18 and regions of the semiconductor chip 1 connected to the second electrical connection region 19.

The second electrical connection layer advantageously extends through a plurality of holes 25, which extend through the p-doped region 4 of the semiconductor layer sequence and the active layer 3 as far as into the n-doped semiconductor region 2. In the region of the holes, the second electrical connection layer 9 is insulated from the p-doped semiconductor region 4 and the active layer 3 by passivated semiconductor regions 7. The passivated semiconductor regions 7 may be produced by bombarding the material of the p-doped region 4 or the active layer 3 of the semiconductor layer sequence 20 with high-energy ions, in particular argon ions. It would alternatively also be possible to insulate the second electrical connection layer 9 from the adjoining semiconductor regions in the region of the holes 25 by means of a further insulating layer.

Because the second electrical connection layer 9 extends through a plurality of holes 25 into the n-doped semiconductor region 2, a high current carrying capacity is achieved. Furthermore, the described contacting method has the advantage that a radiation exit face 32 on the opposite side of the semiconductor chip 1 from the carrier 12 has no electrical contacts, which might bring about partial absorption of the radiation emitted by the active layer 3. So as further to improve outcoupling of radiation from the optoelectronic component, the radiation exit face 32 is provided with roughening or an outcoupling structure 21.

To improve the efficiency of the optoelectronic component further, the side of the p-doped semiconductor region 4 facing the carrier 12 is provided with a minor layer 5. The mirror layer 5 preferably comprises silver or consists thereof.

To protect the mirror layer 5 from corrosion, said layer is provided with an encapsulation layer 6. The encapsulation layer 6 may comprise a plurality of sub-layers. The encapsulation layer 6 may in particular be a layer sequence consisting of Pt/Au/Ti.

Advantageously, the first and second electrical connection layers 8, 9 also each contain or consist of silver. In order also to protect the electrical connection layers 8, 9 from corrosion, said layers are provided with an electrically conductive barrier layer 11, which may in particular contain TiWN. The barrier layer 11 may also be built up from a plurality of sub-layers.

The minor layer 5, the encapsulation layer 6 and the barrier layer 11 are each formed of electrically conductive materials, such that the current path between the electrical connection regions 18, 19 and the p-doped semiconductor region 4 or the n-doped semiconductor region 2 respectively is not interrupted by said layers. The electrical connection layers 8, 9 do not therefore have directly to adjoin the electrical connection regions 18, 19, but rather sub-regions of the mirror layer 5, the encapsulation layer 6 or the barrier layer 11 may be arranged within the current path.

In the following FIGS. 2A to 2M an exemplary embodiment of a method for producing the optoelectronic component is described. The above-described advantageous configurations of individual elements of the optoelectronic component apply in the same way to the method described below and vice versa.

In the intermediate step of the method shown in FIG. 2A, the semiconductor layer sequence 20, which comprises the n-doped semiconductor region 2, the active layer 3 and the p-doped semiconductor region 4, has been grown on a growth substrate 27. The growth substrate 27 may for example be a silicon substrate. Alternatively, the growth substrate 27 may for example comprise GaN, sapphire or SiC. The semiconductor layer sequence 20 is preferably produced epitaxially, in particular by means of metalorganic vapour phase epitaxy (MOVPE). The n-doped semiconductor region 2, the active layer 3 and the p-doped semiconductor region 4 may in each case be composed of a plurality of individual layers, which are not shown in detail for simplicity's sake.

In the intermediate step shown in FIG. 2B, a mirror layer 5 has been applied to the semiconductor layer sequence 20. The mirror layer 5 preferably comprises a silver layer. To protect the mirror layer 5 from corrosion, it is covered with an encapsulation layer 6, wherein the encapsulation layer 6 may be composed of a plurality of sub-layers. In particular, the encapsulation layer 6 may be a Pt/Au/Ti layer sequence.

Figure 2C:
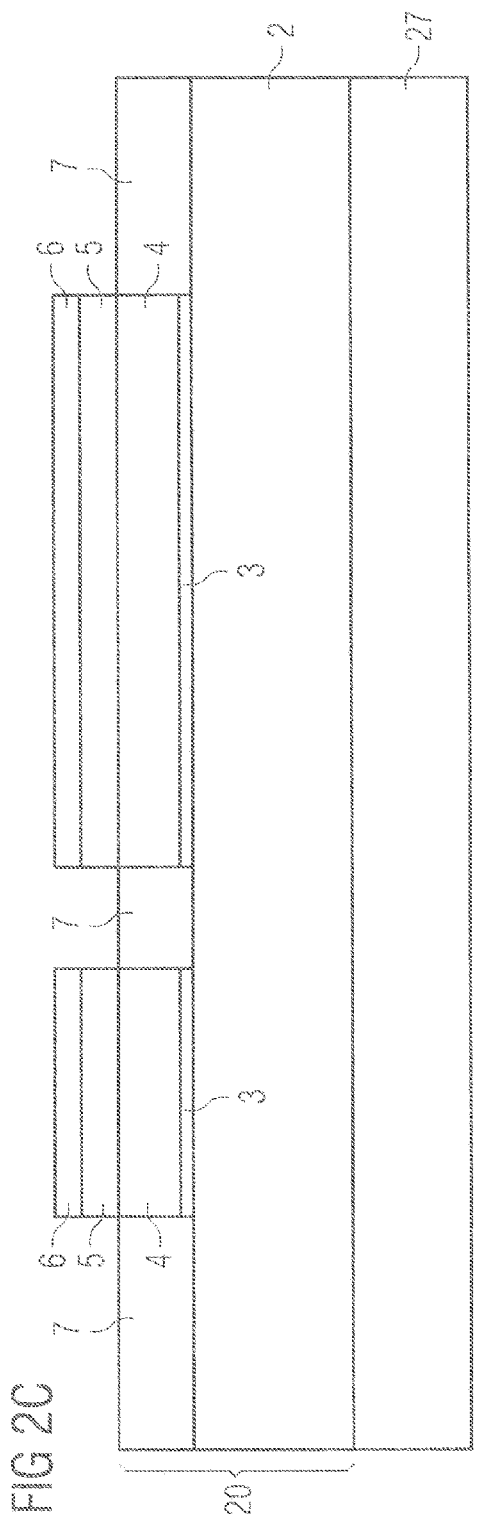

In the intermediate step illustrated in FIG. 2C, the minor layer 5 and the encapsulation layer 6 have been patterned such that they cover two spatially separate regions of the semiconductor layer sequence 20. The layers are patterned in both this method step and the intermediate steps described below in each case using techniques such as photolithography, etching processes and lift-off processes, which are known per se to a person skilled in the art and are therefore not explained in detail.

Furthermore, in the intermediate step shown in FIG. 2C the p-doped semiconductor region 4 has been passivated in regions 7 arranged between and outside the regions of the semiconductor layer sequence covered by the mirror layer and the encapsulation layer. The passivated regions 7 may for example be produced by bombarding the p-doped semiconductor material with argon ions. Preferably, the passivated regions 7 extend into the active layer 3, such that the pn-junction is cut through by the electrically insulating passivated regions 7.

Figure 2D:
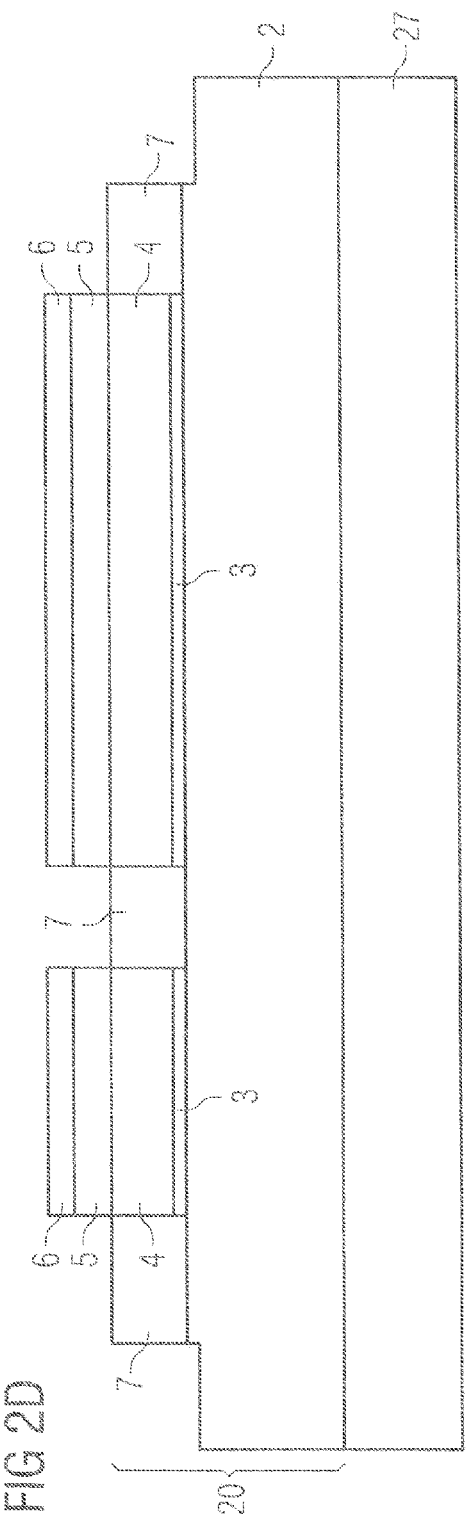

In the intermediate step shown in FIG. 2D mesa etching has been carried out in the peripheral regions of the semiconductor layer sequence 20, in which process the semiconductor layer sequence 20 has been removed as far as into the n-doped semiconductor region 2.

An electrically insulating layer 10 has been applied to the pattern produced in this way in the intermediate step shown in FIG. 2E. The electrically insulating layer 10 may in particular be an $SiO_2$ layer.

In the intermediate step shown in FIG. 2F etching processes have been used to produce openings in the insulating layer 10 and generate holes 25 which extend through the passivated regions 7 of the p-doped semiconductor region 4 and the active layer 3 as far as into the n-doped semiconductor region 2. Moreover, a recess 30 has been produced in the encapsulation layer 6.

Figure 2G:
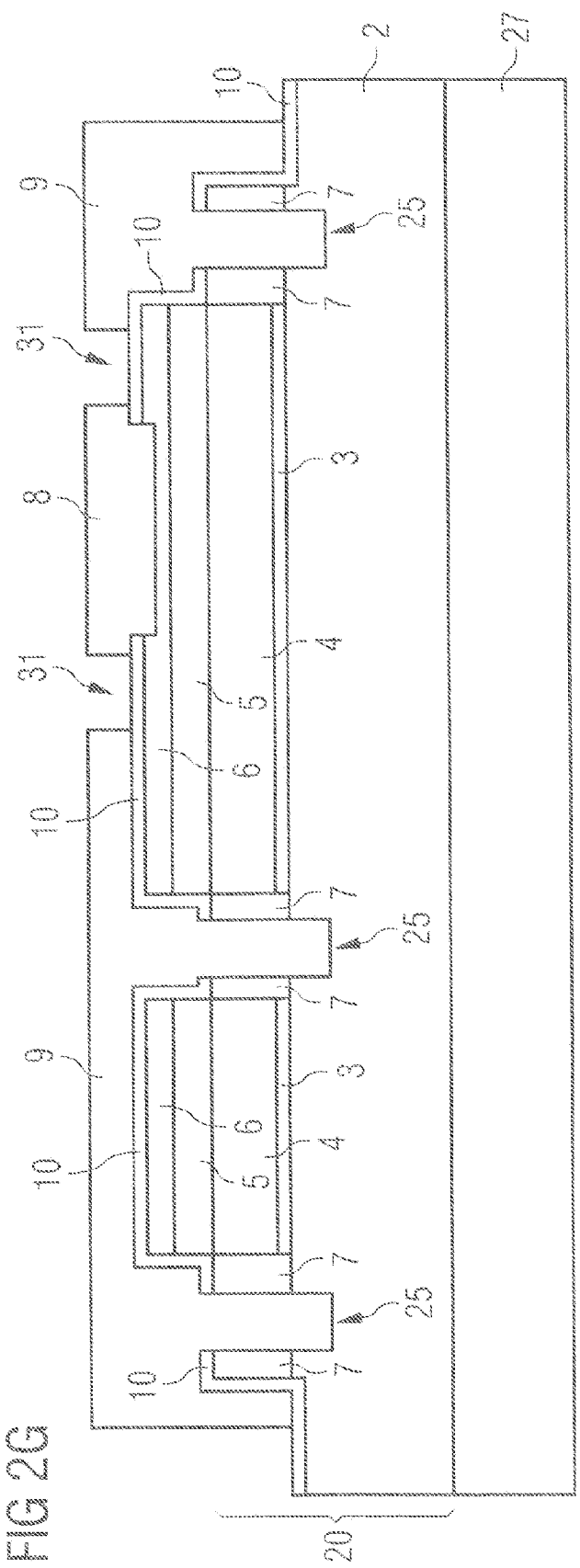

In the method step shown in FIG. 2G a first electrical connection layer 8 and a second electrical connection layer 9 have been applied and patterned. The first electrical connection layer 8 and the second electrical connection layer 9 may in particular contain or consist of silver.

The first electrical connection layer 8 adjoins the encapsulation layer 6, which is connected to the p-doped semiconductor region 4 by way of the electrically conductive minor layer 5. The first electrical connection layer 8 is thus intended for contacting the p-doped semiconductor region 4. The second electrical connection layer 9 extends through the holes 25 as far as into the n-doped semiconductor region 2. The second electrical connection layer 9 is thus intended for contacting the n-doped semiconductor region 2. The first electrical connection layer 8 and the second electrical connection layer 9 are separated from one another by recesses 31.

Figure 2H:
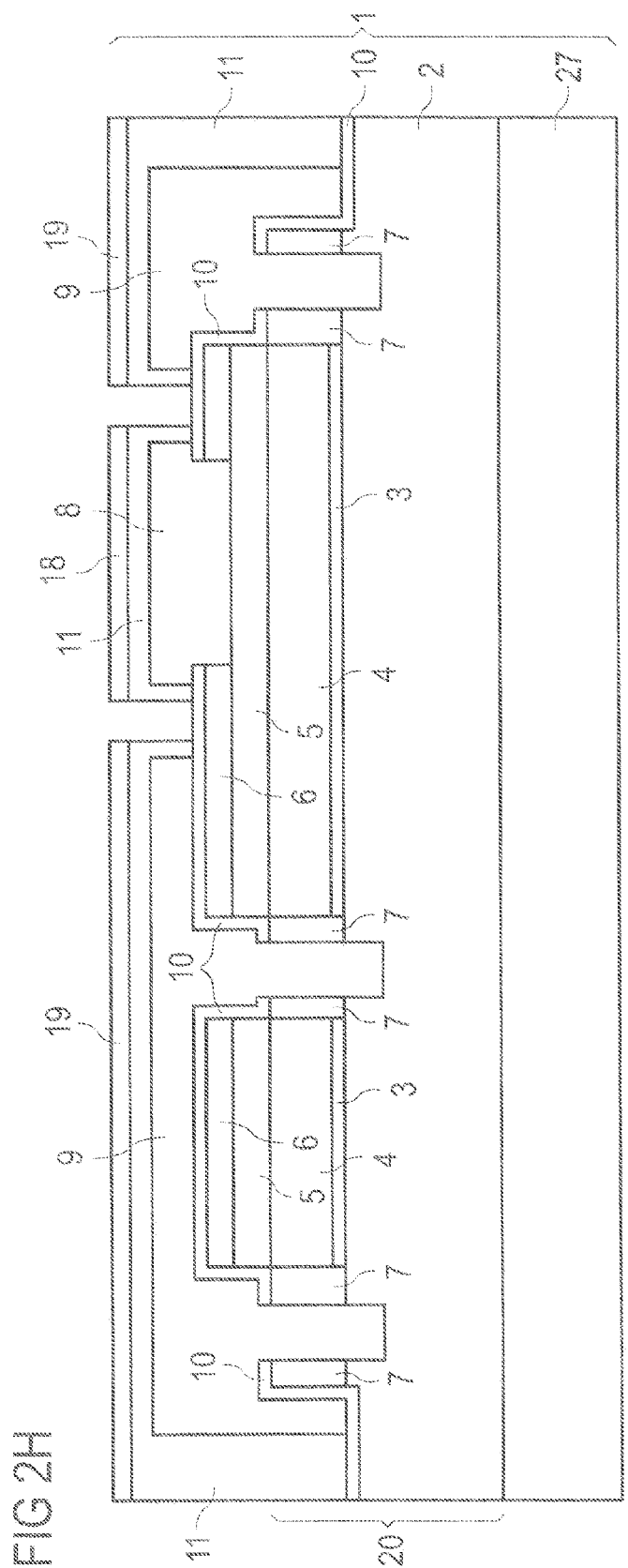

In the intermediate step shown in FIG. 2H, a barrier layer 11 has been applied to the first connection layer 8 and the second connection layer 9. The barrier layer 11 may in particular contain TiWN. It is also possible for the barrier layer 11 to be composed of a plurality of individual layers. The barrier layer 11 protects the first electrical connection layer 8 and the second electrical connection layer 9, which preferably contain silver, from corrosion. Furthermore, in the intermediate step shown in FIG. 2H a contact metallisation has been applied to the barrier layer 11, to form the first electrical connection region 18 and the second electrical connection region 19 of the semiconductor chip 1 produced in this way. The contact metallization 18, 19 may in particular be a Ti/Pt/Au layer sequence. The first electrical connection region and the second electrical connection region are insulated from one another by the recess 31.

Figure 2I:
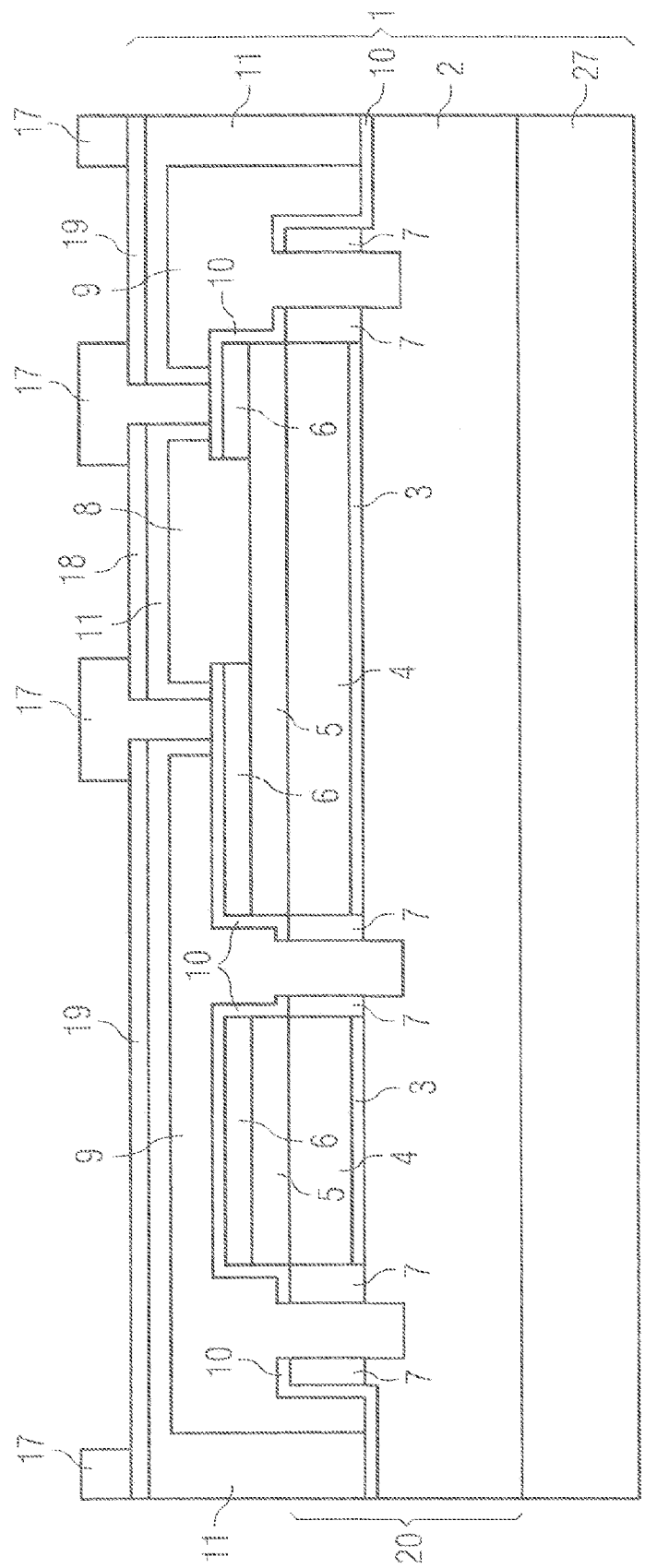

In the method step shown in FIG. 2I, the recesses 31 were filled with an electrically insulating material 17. The electrically insulating material 17 may in particular be a polymer, preferably polyimide. The layer of electrically insulating material 17 insulates the electrical connection regions 18, 19 from one another and projects over sub-regions of the electrical connection regions 18, 19. Furthermore, the insulating material 17 has also been applied to the connection regions 18, 19 at the sides of the semiconductor chip.

Figure 2J:
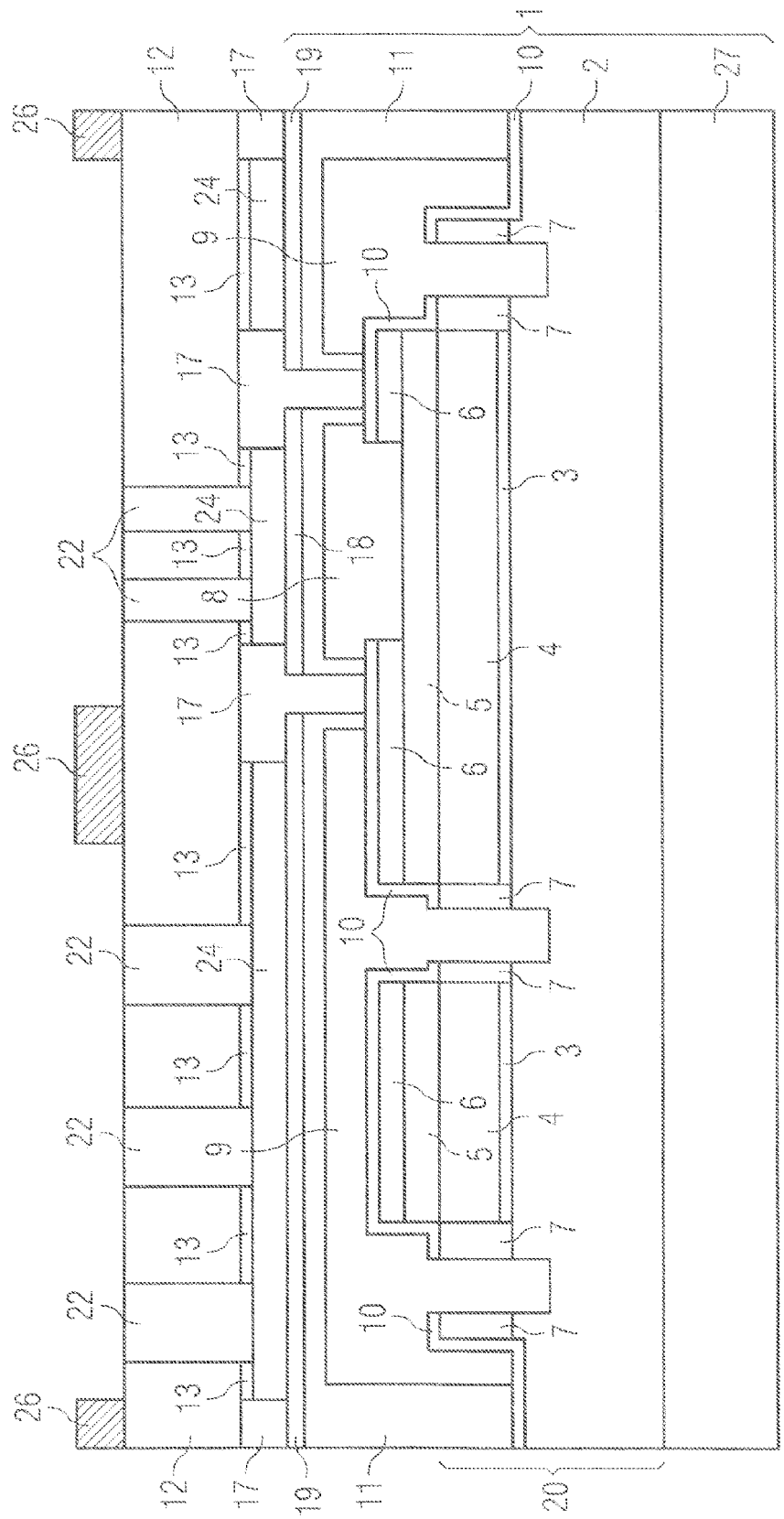

In the intermediate step shown in FIG. 2J, a carrier 12 has been applied to the semiconductor chip 1, wherein the electrically insulating material 17 projecting over the electrical connection regions 18, 19 acts as a spacer, so resulting in a space 24 between the semiconductor chip 1 and the carrier 12. The carrier 12 comprises a plurality of openings 22, which are intended to form vias through the carrier 12. The side of the carrier 12 facing the semiconductor chip 1 may be provided with a wetting layer 13. The back of the carrier 12 remote from the semiconductor chip 1 is advantageously provided with a patterned layer 26, which serves as a mask for forming electrical back contacts on the back of the carrier 12.

FIG. 2K shows a plan view of the back of the carrier 12. The patterned layer 26, which may in particular be a solder resist layer, defines two regions which serve to form the electrical back contacts 28, 29 of the carrier 12. The plan view of the back also shows the for example cylindrical openings 22 for the vias.

Figure 2L:
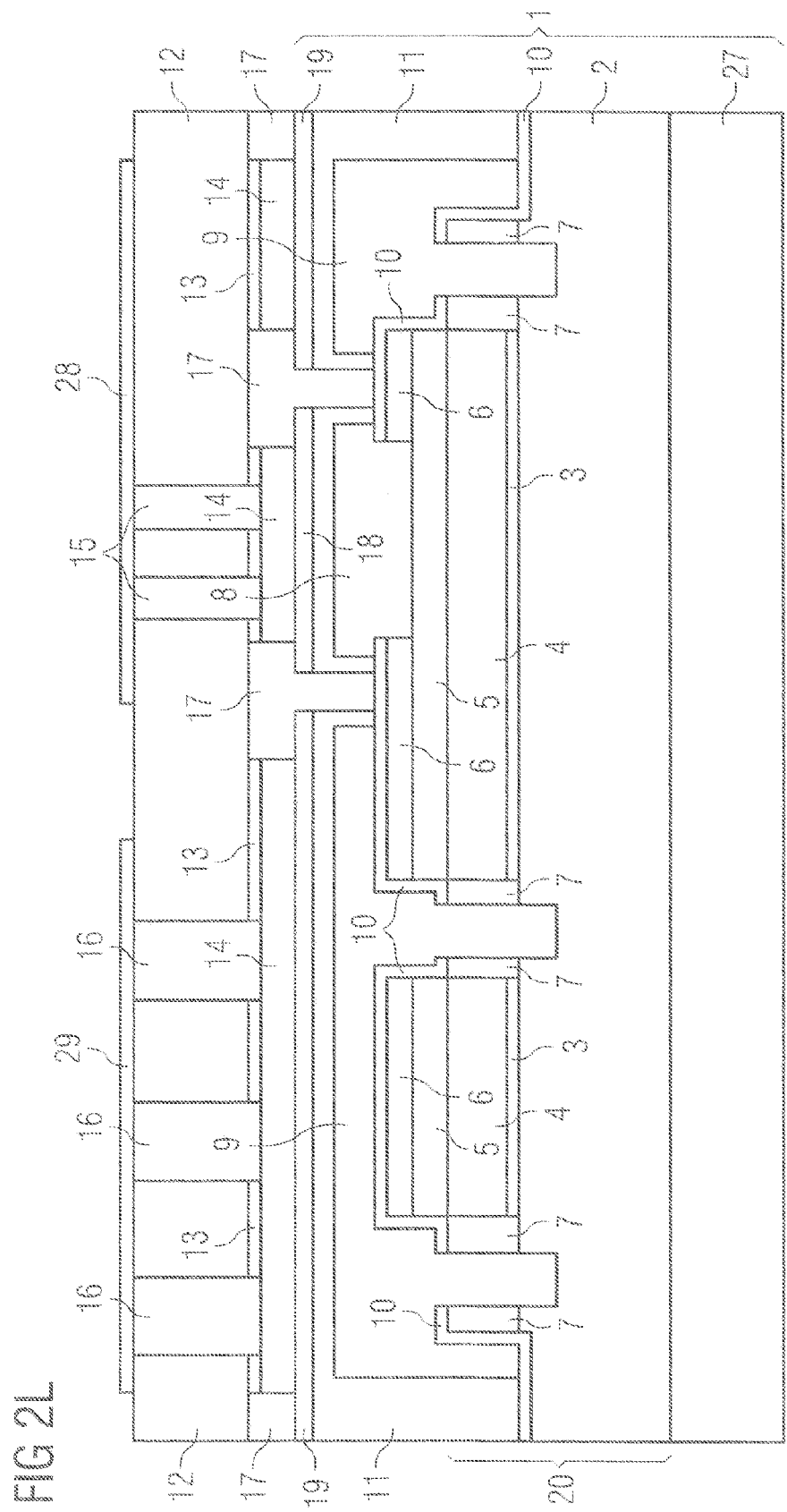

In the intermediate step shown in FIG. 2L a bonding layer 14 has been produced between the carrier 12 and the semiconductor chip 1, by introducing a liquid metal or a liquid metal alloy through the openings 22 of the carrier 12 into the space 24. In this method step the vias 15, 16 and the first back contact 28 and the second back contact 29 have also been produced at the same time. Preferably the bonding layer 14, the vias 15, 16 and the first back contact 28 and the second back contact 29 therefore each consist of the same material, for example Cu, Au, AuSn or BiAg. The patterned layer 26 serving as a mask to form the back contacts 28, 29 has already been removed again in the intermediate step shown in FIG. 2L.

Figure 2M:
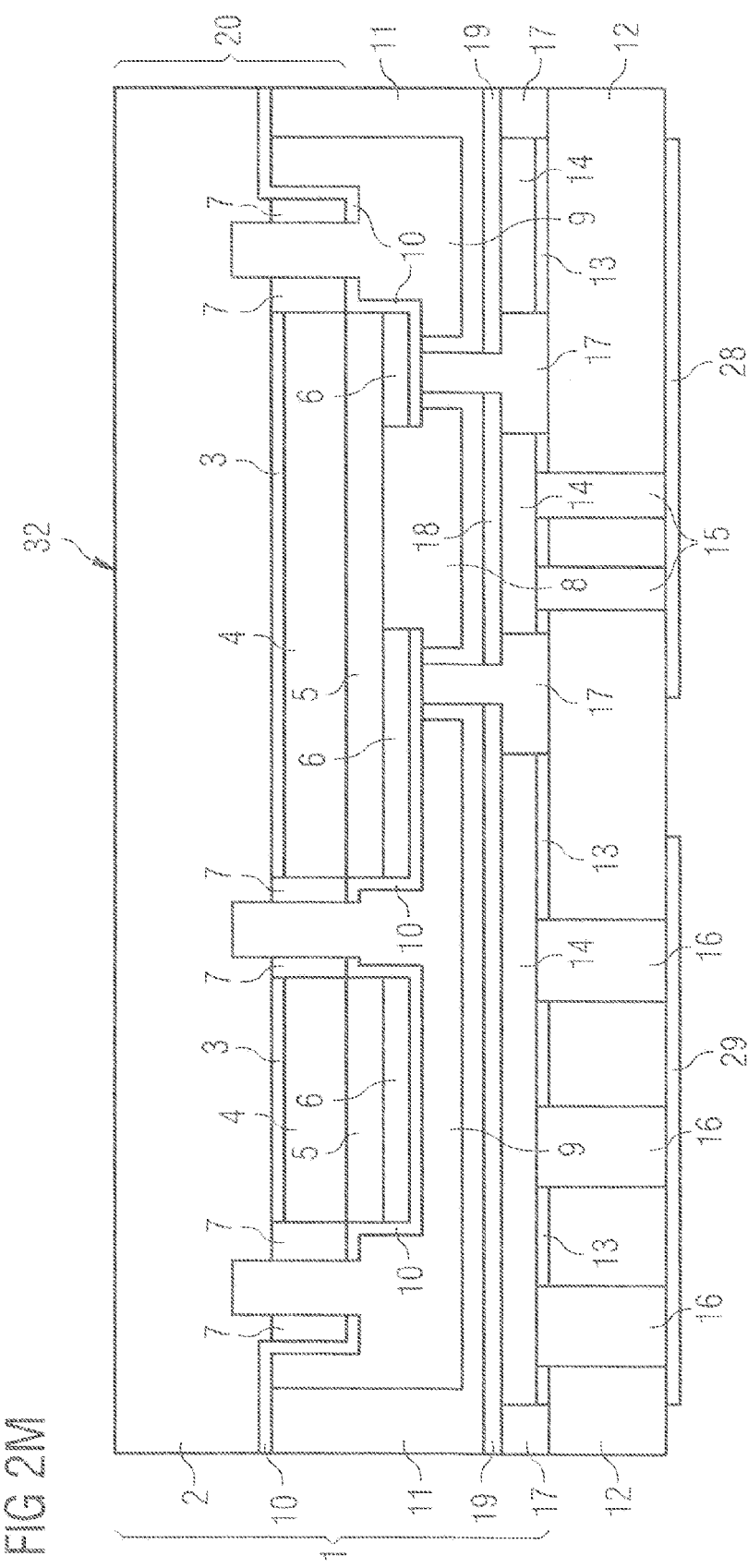

In the intermediate step shown in FIG. 2M the growth substrate used to grow the semiconductor layer sequence 20 has been detached from the semiconductor chip 1, leaving only the carrier 12, on the opposite side from the original growth substrate, to serve as a load-bearing support for the semiconductor chip. The illustration in FIG. 2M has therefore been rotated by 180° compared with the previous figures.

The surface of the n-doped semiconductor region 2, on which the original growth substrate was arranged, is now provided as a radiation exit face 32 of the semiconductor chip 1. The surface of the n-doped semiconductor region 2 which serves as a radiation exit face 32, may be provided in a further method step with a surface pattern or roughening 21, for example by means of an etching process using KOH. The optoelectronic component produced in this way then corresponds to the optoelectronic component shown in FIG. 1.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic component comprising:
   a semiconductor chip, which comprises a semiconductor layer sequence with an active layer; and
   a carrier, which is bonded to the semiconductor chip by a bonding layer of a metal or a metal alloy and a plurality of vias extending through the carrier,
   wherein the semiconductor chip comprises a first electrical connection region and a second electrical connection region,
   wherein the first electrical connection region and the second electrical connection region face the carrier,
   wherein the carrier comprises a first electrical back contact and a second electrical back contact on a surface remote from the semiconductor chip,
   wherein the first electrical back contact is connected electrically conductively to the first electrical connection region by a first one of the vias extending through the carrier,
   wherein the second electrical back contact is connected electrically conductively to the second electrical connection region by a second one of the vias extending through the carrier, wherein the first back contact is also connected to the first electrical connection region by a third one of the vias extending through the carrier, wherein the semiconductor layer sequence comprises:
an n-doped semiconductor region and a p-doped semiconductor region, wherein the p-doped semiconductor region faces the carrier;
a first electrical connection layer, which connects the first electrical connection region to the p-doped semiconductor region; and
a second electrical connection layer, which connects the second electrical connection region to the n-doped semiconductor region, and
wherein a sub-region of the second electrical connection layer extends through at least one hole, which passes through the p-doped semiconductor region and the active layer, into the n-doped semiconductor region.

2. The optoelectronic component according to claim 1, wherein the first electrical back contact is connected to the first electrical connection region by more than one of the vias extending through the carrier and wherein the second electrical back contact is connected to the second electrical connection region by more than one of the vias extending through the carrier.

3. The optoelectronic component according to claim 1, wherein at least one via of the plurality of vias has a width of at least 30 μm.

4. The optoelectronic component according to claim 1, wherein at least one via of the plurality of vias has a width of at least 60 μm.

5. The optoelectronic component according to claim 1, wherein the second electrical connection layer comprises a plurality of sub-regions that extend through a plurality of holes in the active layer into the n-doped semiconductor region.

6. The optoelectronic component according to claim 1, wherein the bonding layer comprises at least two electrically mutually insulated sub-regions, which are separated from one another by an electrically insulating material.

7. The optoelectronic component according to claim 6, wherein the electrically insulating material is a polymer.

8. The optoelectronic component according to claim 1, wherein the vias are formed of the same metal or the same metal alloy as the bonding layer.

9. The optoelectronic component according to claim 8, wherein the metal or the metal alloy contains Cu, Au, AuSn or BiAg.

10. The optoelectronic component according to claim 1, wherein the first electrical back contact and the second electrical back contact are formed of the same metal or the same metal alloy as the vias.

11. The optoelectronic component according to claim 10, wherein the metal or the metal alloy contains Cu, Au, AuSn or BiAg.

12. The optoelectronic component according to claim 10, wherein the metal or the metal alloy is free of shrinkage holes.

13. A method for producing an optoelectronic component, the method comprising:
providing a carrier, which comprises a plurality of openings for forming vias;
providing a semiconductor chip, which comprises a first electrical connection region and a second electrical connection region, the first electrical connection region and the second electrical connection region being separated from one another by a recess in the semiconductor chip;
filling the recess with an electrically insulating material so that the electrically insulating material projects over a sub-region of the connection regions;
placing the carrier onto the semiconductor chip, the electrically insulating material which projects over the connection regions functioning as a spacer layer, such that a space arises between the semiconductor chip and the carrier; and
introducing a liquid metal or a liquid metal alloy through the openings in the carrier into the space, the metal or the metal alloy forming a bonding layer that attaches the semiconductor chip to the carrier and also forming vias that electrically connect the first and second electrical connection regions of the semiconductor chip to a bottom side of the carrier.

14. The method according to claim 13, wherein one or more of the vias electrically connects the first electrical connection region of the semiconductor chip to the bottom side of the carrier and two or more of the vias electrically connect the second electrical connection region of the semiconductor chip to the bottom side of the carrier.

15. The method according to claim 13, wherein back contacts are also formed during formation of the bonding layer and the vias, the first electrical connection region of the semiconductor chip being electrically connected to a first one of the back contacts by a first one of the vias and the second electrical connection region of the semiconductor chip being electrically connected to a second one of the back contacts by a second one of the vias.

16. The method according to claim 15, further comprising, prior to introduction of the liquid metal or the liquid metal alloy into the openings, applying a patterned layer to the back of the carrier, the patterned layer serving as a mask to form the first and second ones of the back contacts.

17. The method according to claim 15, wherein one or more of the vias electrically connects the first electrical connection region of the semiconductor chip to the first one of the back contacts and two or more of the vias electrically connect the second electrical connection region of the semiconductor chip to the second one of the back contacts.

18. The method according to claim 13, wherein the electrically insulating material comprises a polymer.

19. An optoelectronic component comprising:
a semiconductor chip, which comprises a semiconductor layer sequence with an active layer; and
a carrier, which is bonded to the semiconductor chip by a bonding layer of a metal or a metal alloy,
wherein the semiconductor chip comprises a first electrical connection region and a second electrical connection region,
wherein the first electrical connection region and the second electrical connection region face the carrier,
wherein the carrier comprises a first electrical back contact and a second electrical back contact on a back surface remote from the semiconductor chip,
wherein the first electrical back contact is connected electrically conductively to the first electrical connection region by at least one via extending through the carrier,
wherein the second electrical back contact is connected electrically conductively to the second electrical connection region by at least two vias extending through the carrier,
wherein the vias are formed of the same metal or the same metal alloy as the bonding layer, wherein the semiconductor layer sequence comprises:
- an n-doped semiconductor region and a p-doped semiconductor region, wherein the p-doped semiconductor region faces the carrier;
- a first electrical connection layer, which connects the first electrical connection region to the p-doped semiconductor region; and
- a second electrical connection layer, which connects the second electrical connection region to the n-doped semiconductor region, and wherein a sub-region of the second electrical connection layer extends through at least one hole, which passes through the p-doped semiconductor region and the active layer, into the n-doped semiconductor region.

* * * * *